(12) United States Patent
Bienek

(10) Patent No.: US 11,678,463 B2
(45) Date of Patent: Jun. 13, 2023

(54) FANLESS COOLING SYSTEM

(71) Applicant: SIEMENS MOBILITY GMBH, Munich (DE)

(72) Inventor: Frank Bienek, Wolfenbuettel (DE)

(73) Assignee: Siemens Mobility GmbH, Munich (DE)

( * ) Notice: Subject to any disclaimer, the term of this patent is extended or adjusted under 35 U.S.C. 154(b) by 0 days.

(21) Appl. No.: 16/770,690

(22) PCT Filed: Nov. 8, 2018

(86) PCT No.: PCT/EP2018/080551
§ 371 (c)(1),
(2) Date: Jun. 8, 2020

(87) PCT Pub. No.: WO2019/110233
PCT Pub. Date: Jun. 13, 2019

(65) Prior Publication Data
US 2021/0168971 A1  Jun. 3, 2021

(30) Foreign Application Priority Data

Dec. 7, 2017 (DE) .............................. 102017222148

(51) Int. Cl.
*H05K 7/20* (2006.01)
*H05K 5/00* (2006.01)
(Continued)

(52) U.S. Cl.
CPC ....... *H05K 7/20336* (2013.01); *H05K 5/0026* (2013.01); *B60R 16/0231* (2013.01); *B61D 27/0072* (2013.01)

(58) Field of Classification Search
CPC .......................... H05K 7/2039; H05K 7/20854
See application file for complete search history.

(56) References Cited

U.S. PATENT DOCUMENTS 4,596,310 A  6/1986 Hatakeyama et al.
5,243,493 A  9/1993 Jeng et al.
(Continued)

FOREIGN PATENT DOCUMENTS

CN  2263403 Y   9/1997
CN  2731922 Y  10/2005
(Continued)

OTHER PUBLICATIONS

Ceneleg—European Committee for Electrotechnical Standardization: "EN 50155 : Railway applications—Electronic equipment used on rolling stock", Jul. 2007, withdrawn.

*Primary Examiner* — Mukundbhai G Patel
(74) *Attorney, Agent, or Firm* — Laurence A. Greenberg; Werner H. Stemer; Ralph E. Locher

(57) ABSTRACT

A fanless cooling system for particularly fail-safe and efficient cooling of electronic modular systems in vehicles, more particularly in rail vehicles, includes a preferably frame-shaped rack or assembly carrier for holding at least one module or assembly, more particularly a processor module having high-performance multi-core processors. A heat transport body can be mounted in a heat-transferring manner on a part or component of the module. The rack has at least one heat distribution body, to which the heat transport body can be fastened in a heat-transferring manner, preferably detachably, when the module having the part coupled to the heat transfer body is held in the rack. At least one heat tube is connected to the heat distribution body in a heat-transferring manner. An electronic modular system with a fanless cooling system is also provided.

8 Claims, 3 Drawing Sheets

(51) Int. Cl.
*B60R 16/023* (2006.01)
*B61D 27/00* (2006.01)

(56) References Cited

U.S. PATENT DOCUMENTS

| | | | |
|---|---|---|---|
| 6,055,157 A | 4/2000 | Bartilson | |
| 6,804,117 B2 * | 10/2004 | Phillips | F28D 15/0266 361/700 |
| 7,345,877 B2 * | 3/2008 | Asfia | F28D 15/0266 361/700 |
| 7,965,513 B2 | 6/2011 | Zhang et al. | |
| 8,223,497 B2 * | 7/2012 | Sundstrom | H05K 7/20536 361/720 |
| 2006/0227515 A1 | 10/2006 | Enami et al. | |
| 2008/0237845 A1 | 10/2008 | Kim et al. | |
| 2011/0058336 A1 | 3/2011 | Sundstrom et al. | |
| 2011/0157832 A1 | 6/2011 | Hongo | |
| 2014/0203741 A1 | 7/2014 | Ohfuchi | |
| 2015/0181763 A1 * | 6/2015 | de Bock | H05K 9/0062 361/689 |
| 2017/0245396 A1 | 8/2017 | Bilski et al. | |
| 2018/0112906 A1 | 4/2018 | Yi et al. | |

FOREIGN PATENT DOCUMENTS

| | | |
|---|---|---|
| CN | 1987728 A | 6/2007 |
| CN | 201004751 Y | 1/2008 |
| CN | 101156126 A | 4/2008 |
| CN | 101207110 A | 6/2008 |
| CN | 101308318 A | 11/2008 |
| CN | 101600325 A | 12/2009 |
| CN | 102065666 A | 5/2011 |
| CN | 102215658 A | 10/2011 |
| CN | 102709262 A | 10/2012 |
| CN | 103025119 A | 4/2013 |
| CN | 103167779 A | 6/2013 |
| CN | 203645899 U | 6/2014 |
| CN | 103945674 A | 7/2014 |
| CN | 205430864 U | 8/2016 |
| CN | 205983369 U | 2/2017 |
| CN | 206118265 U | 4/2017 |
| CN | 206272641 U | 6/2017 |
| CN | 206350287 U | 7/2017 |
| CN | 107076504 A | 8/2017 |
| CN | 107371351 A | 11/2017 |
| CN | 206649446 U | 11/2017 |
| DE | 10309130 A1 | 9/2004 |
| DE | 102015202487 A1 | 8/2015 |
| TW | 446143 U | 7/2001 |

* cited by examiner

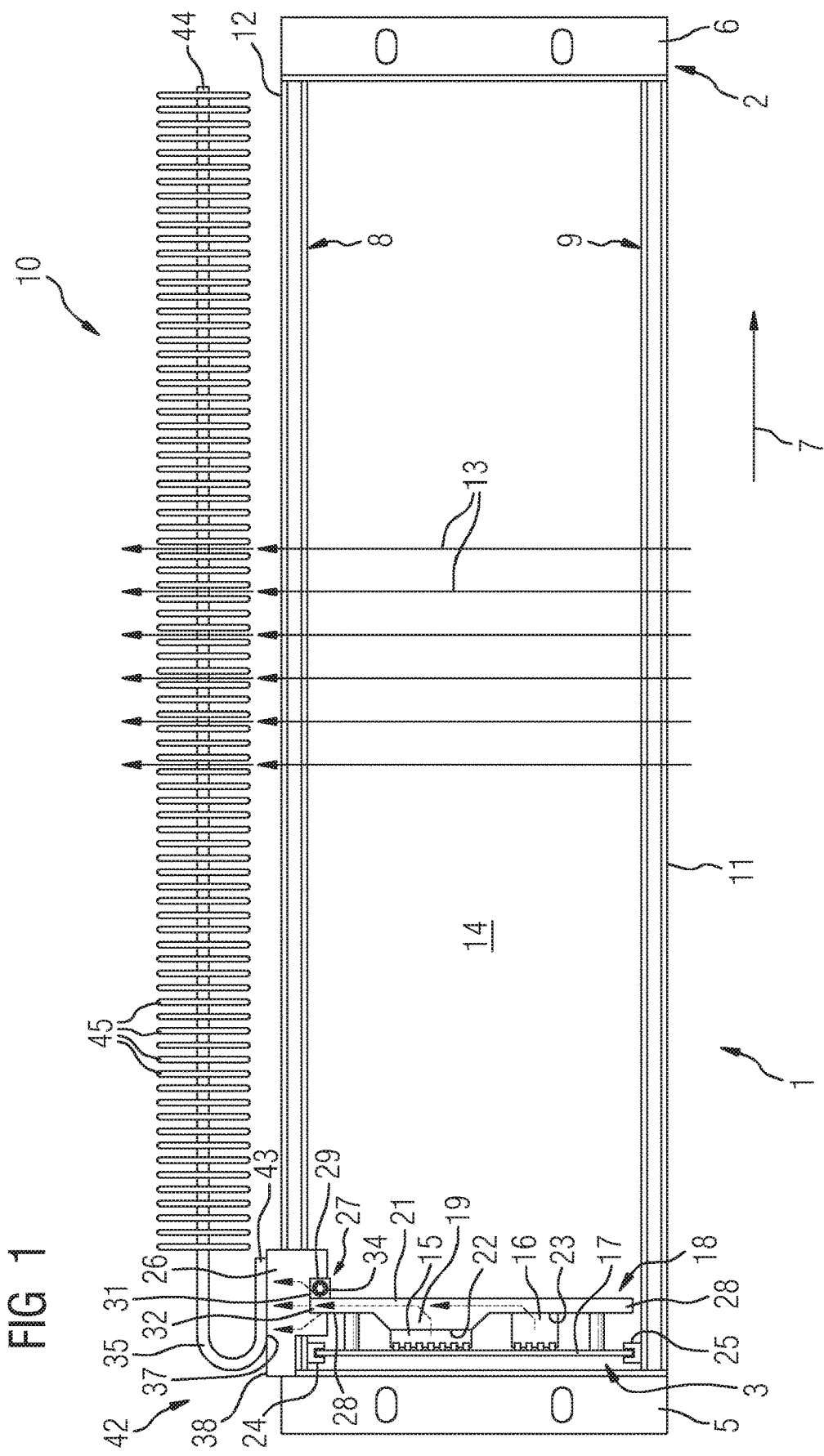

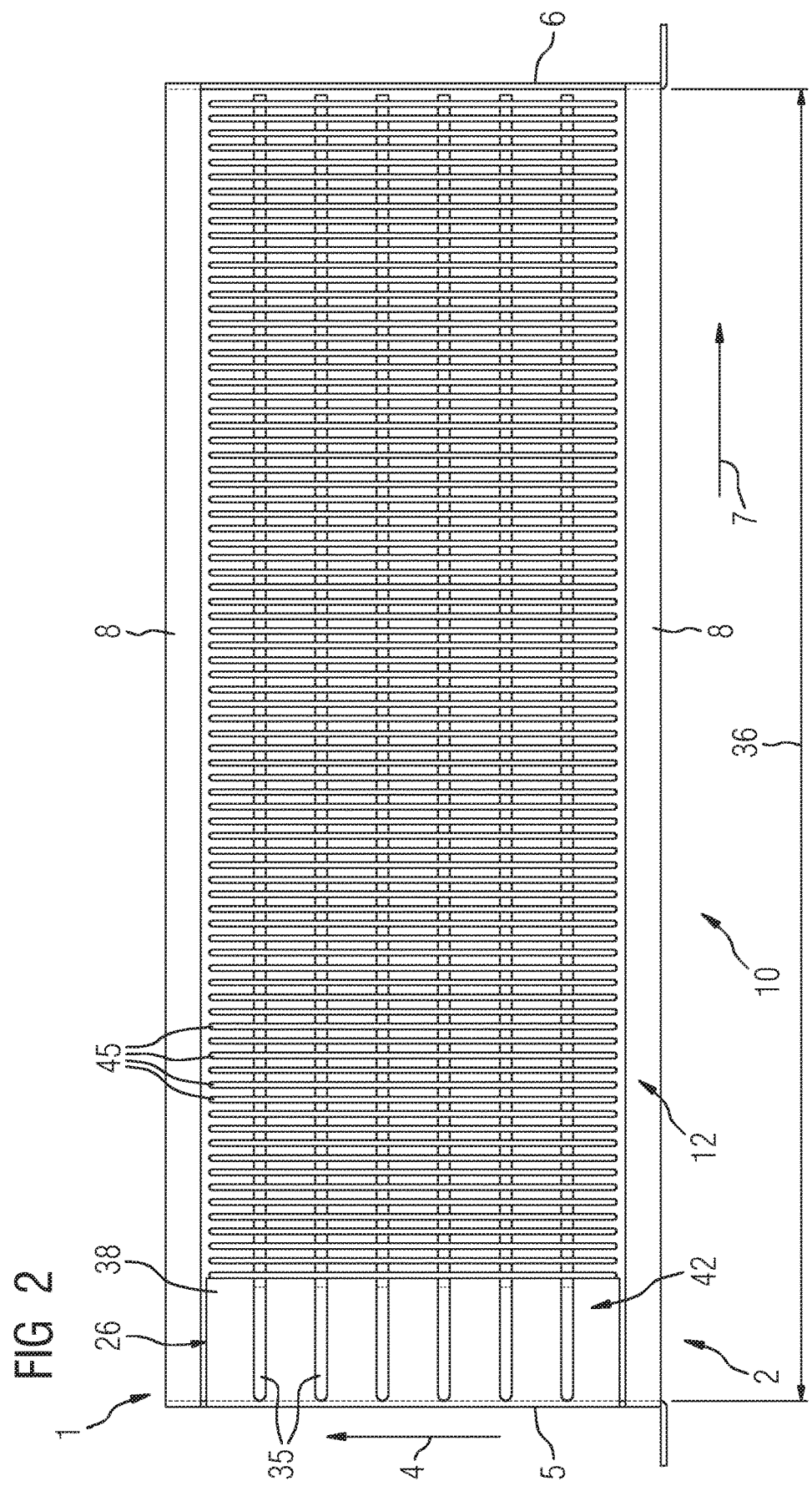

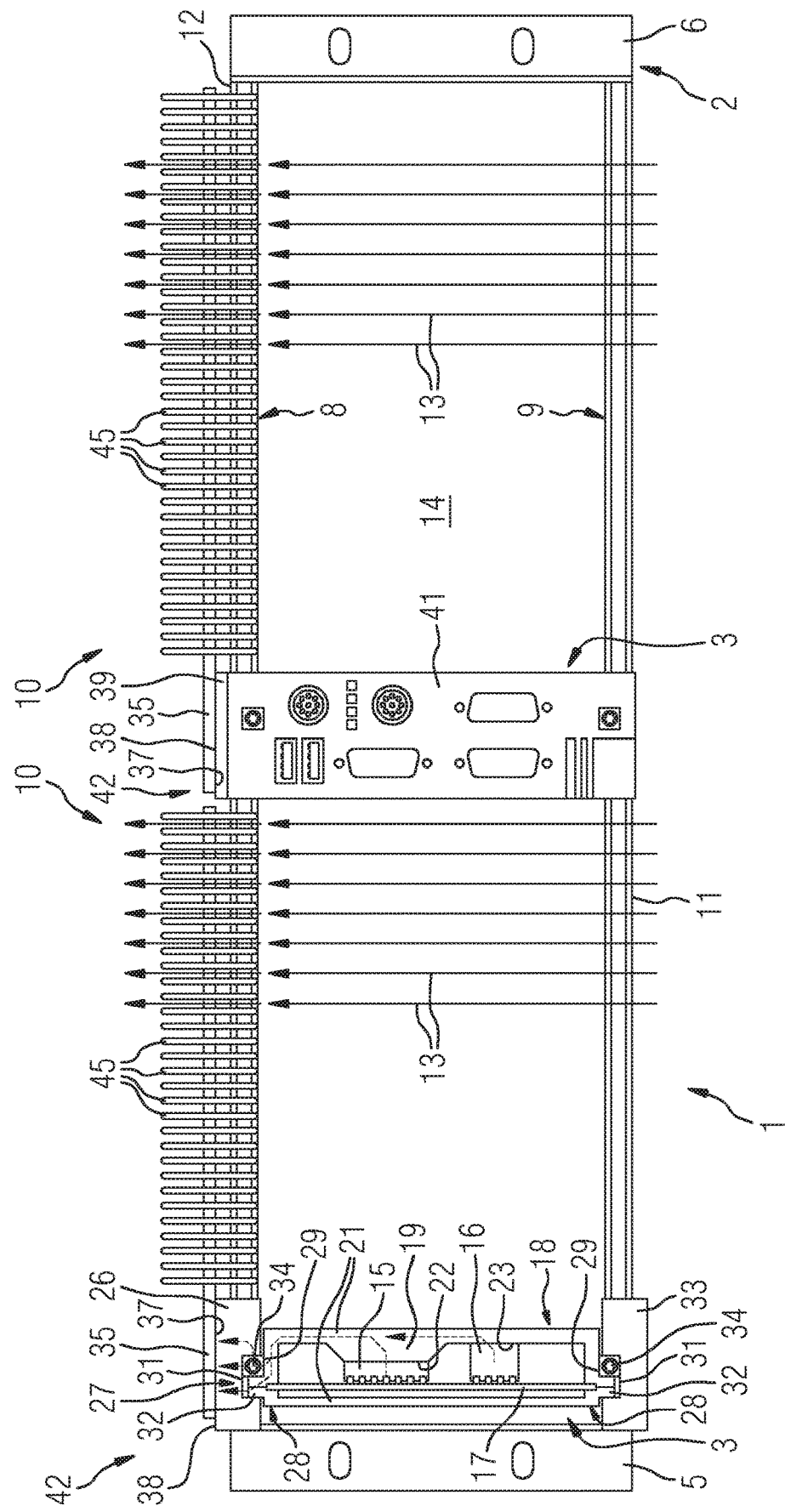

FANLESS COOLING SYSTEM

BACKGROUND OF THE INVENTION

Field of the Invention

The invention relates to a fanless cooling system for electronic modular systems for use in vehicles, in particular in rail vehicles.

It is known from the prior art that in a processor module used on the vehicle side (e.g. with an Intel Atom processor) with up to 12 watts power loss, the power loss is emitted to the surrounding area via the surface of the part, or via a sufficiently dimensioned, module-internal cooling body, in each case in conjunction with free air convection. In this context, a value of 70° C. is defined as the upper limit for the operating temperature range. A fan is not required for a reliable operation of such a processor module. In order to implement such vehicle-side computer platforms, electronic modular systems are generally used, in which the processor modules are accommodated in standardized racks, e.g. in 19-inch racks.

The modules typically involve cuboid modules which can be inserted into the frame-shaped rack, the rack having suitable guides for this purpose. Typically, the modules can be plugged into slots of a backplane bus and electrically interconnected thereby. In this context, the processor modules are generally designed as plug-in modules, which can be plugged into slots of a backplane bus and electrically interconnected thereby. One advantage of said modular system consists in being able to swap modules with little effort. To this end, they merely need to be pulled out from the rack.

For new computer platforms for train protection equipment, provision is made for equipping central computers with high-performance multi-core CPUs (multi-core processors), wherein the number of active cores should be 8 or 16, for example. Such microprocessors with multiple complete main processor cores in a single chip are a great deal more powerful compared to single-core processors. Further functions (balise channel, I/O functions, odometry interfaces) are then linked to a central computer of this kind as decentralized devices via an on-board communication network.

The power loss of such high-performance multi-core processors (e.g. with Intel Xeon processor) is a great deal higher than in current processors used on the vehicle side. Based on current information, a power loss of up to 70 watts then has to be assumed. It is not possible to implement a sufficient dissipation of the power loss using simple cooling bodies with free convection of air and taking into consideration environmental requirements (EN50155, TX). For this reason, previously computer platforms with multi-core processors have not been used for train protection equipment, or the applications use only a single core of a dual-core or quad-core processor, while the remaining cores are switched off, so that they do not produce considerably less power loss.

It is indeed known for example to actively cool servers and other high-performance computers, for example with the aid of water cooling, or to undertake an active air conditioning of the installation space of said computer. Such measures, however, are too elaborate for the cooling of computers in railway vehicles and are therefore not applicable. This then applies in particular if a high degree of fault tolerance has to be guaranteed, for example when providing train protection equipment.

SUMMARY OF THE INVENTION

An object of the present invention is to provide a particularly fault-tolerant solution for the efficient cooling of electronic modular systems for use in vehicles, in particular in rail vehicles. This object is achieved by a cooling system as described below and by an electronic modular system as described below, respectively.

Accordingly, a fanless cooling system according to the invention comprises a preferably frame-shaped rack for accommodating at least one module, in particular a processor module with high-performance multi-core processors, as well as a heat transport body, which can be attached to a part of the module in a heat-transferring manner, wherein the rack has at least one heat distribution body, to which the heat transport body can be fastened in a heat-transferring manner, preferably in a releasable manner, when the module, to the part of which the heat transport body is coupled, is accommodated in the module, wherein there is provision for at least one heat pipe connected to the heat distribution body in a heat-transferring manner.

The electronic modular system according to the invention is characterized by such a fanless cooling system for the cooling of a processor module, accommodated in the rack and having a number of multi-core processors, for a vehicle-side computer platform for a piece of train protection equipment.

By way of the invention, a fanless and thus particularly fault-tolerant solution is provided for efficient cooling for electronic modular systems for use in vehicles, in particular in rail vehicles, which ensures a heat dissipation of modules with high power loss, in particular of high-performance multi-core processor modules, without limiting the ability to swap the modules.

Advantageous embodiments of the invention are set out in the subclaims.

In order to derive the power loss of high-performance multi-core processors of the module and, according to the higher power loss, to also implement an enlarged cooling body surface, a combined application of two cooling technologies is proposed.

In this context, for reasons of operational safety, a fan is provided neither on the module itself nor for aerating the rack as a whole. The solutions known from laptops for example are also disregarded, in which the cooling bodies or in general the heat sinks are attached directly to the circuit board or to the heat source, i.e. to the part arranged on the circuit board.

According to the invention, the principle of conduction cooling is used in order to transport the heat away from the heat source or heat sources, i.e. away from the module in this case, and toward the rack, from where the heat is dissipated with the aid of further measures. These further measures preferably involve the use of a heat pipe with a large number of cooling bodies. From there, the heat is dissipated out of the rack and eventually out of the overall modular system via convection cooling.

Advantageous for this purpose is the rack embodied as a frame or in a frame-shaped manner, which typically has two side parts and four connecting webs, wherein for example the side parts are screwed to the corners of the connecting webs, embodied such that the bottom side and the top side of the rack are at least partially permeable to air, so that the rack is ventilated by convection even without fans, by an ascending air flow serving to take the heat away from the cooling elements and thus to cool down the modular system.

In other words, the invention proposes the combined use of conduction cooling with a heat pipe. As heat pipes, for functional reasons, make it possible to uncouple the heat absorption and heat emission, the cooling system according to the invention does not rely on the spatial proximity to the heat source. From the at least one conduction-cooled heat source within the module, waste heat can thus be emitted in a targeted manner via heat conduction at the large areas of the rack or the heat pipes attached thereto, and from there into the air flow of a convection cooling. According to the invention, the rack or the heat distribution body connected thereto, and the heat pipes, as well as the cooling bodies which may be attached to the heat pipes, serve as heat sink of the cooling system. In summary, the power loss in the form of heat is therefore initially conducted away from the heat source and the module by way of conduction cooling, in order to then transfer it to the rack or to the functional elements connected to the rack, where the thermal energy supplied in this manner is emitted to an adjacent medium, here preferably air guided by convection. Expressed differently, the rack, which in previous solutions merely served purely as a supporting element for mechanically accommodating and fixing the modules, is itself used as a heat sink. This has the advantage that the entire width and/or length or surface of the rack can be used for the emission of heat to the surrounding area or for the arrangement of cooling elements or the like.

This heat dissipation concept can preferably be used for processor modules, in particular for modules with multi-core processors, in which compared to single-core processors a considerably higher amount of power loss has to be dissipated in order to be able to observe the upper limit of the operating temperature range. It should nevertheless be expected that, should the number of cores in multi-core processors continue to increase, then it can be assumed that the emitted power loss will reduce, resulting in the fanless cooling system according to the invention also further being able to be used in modules with a considerably larger number of main processor cores, for example 32 cores. The invention can also, however, be used in other types of modules, in particular if said modules have parts with pronounced heat build-up.

The invention is preferably designed for use in vehicles, in particular for the cooling of high-performance "on-board" computer platforms. In this context, the invention can be used in particular in railway or rail vehicles. The invention can also be used, however, in other types of vehicles, such as watercraft and aircraft, where similar requirements are placed on fault tolerance and therefore only fanless systems can be used.

The invention is particularly advantageously suitable for the fault-tolerant cooling of computer platforms for vehicle-side train protection equipment. On the basis of the invention, a permanent cooling of the processor module(s) and thus the operational readiness of the corresponding computer platform can be ensured. This is particularly important for train protection equipment, because the functions to be provided there need to satisfy a high safety standard and have a high level of reliability. The failure of one train protection function may lead to the failure of the entire vehicle.

It is particularly advantageous that racks already present can be retrofitted with the components of the cooling system according to the invention. A number of suitable heat distribution bodies and the necessary heat pipes can thus be attached to the rack retrospectively. Likewise, the modules being used in this rack can be retrofitted with a suitable heat transport body. All components of the cooling system are therefore able to be added retrospectively and racks which are already in use are able to accommodate processor modules with multi-core processors without this leading to problems with the dissipation of the power loss.

The above-described characteristics, features and advantages of this invention, as well as the manner in which these are achieved, will become clearer and more readily understandable in connection with the following description of the exemplary embodiments, which are explained in more detail in conjunction with the drawings.

BRIEF DESCRIPTION OF THE SEVERAL VIEWS OF THE DRAWING

FIG. 1 shows a side view of a first embodiment of a cooling system,

FIG. 2 shows a top view of the cooling system from FIG. 1,

FIG. 3 shows a side view of a second embodiment of a cooling system.

DETAILED DESCRIPTION OF THE INVENTION

All the figures simply show the invention schematically and with its essential constituent parts. Identical reference characters here correspond to elements of identical or comparable function.

A frame-shaped 19-inch rack 2, which is able to accommodate one or more processor modules 3 as well as optionally further modules, for example communication modules, serves to implement an electronic modular system 1 for a vehicle-side computer platform for a piece of train protection equipment. The rack 2 has two side parts 5, 6, which stand perpendicular and run in the rack transverse direction 4, and four connecting webs 8, 9, which run in the rack longitudinal direction 7, wherein the side parts 5, 6 are screwed to the corners of the connecting webs 8, 9 or are connected thereto in another manner. In addition, the rack 2 is embodied such that the bottom side 11 and the top side 12 of the rack 2 are at least partially permeable to air. As a result, a free convection is enabled, i.e. an air current 13 from bottom to top through the internal volume 14 of the rack 2. The rack 2 is particularly well suited for dissipating heat, as it possesses a comparatively large surface. In this context, the structural elements of the rack 2 itself may be used as heat conducting bodies or cooling bodies.

The processor module 3 has a multi-core processor 15 with sixteen main processor cores, as well as a further electrical part 16, which emits power loss, is attached to a circuit board 17 of the module 3 and is in contact therewith. Here, each module 3 may have one or more circuit boards 17. These multi-core processors 15 or further parts 16 of the module 3 act as heat sources.

Provided as a constituent part of the module 3 is a heat transport body 18, which can be coupled in a heat-transferring manner to the part 15, 16 of the module 3 from which the power loss in the form of heat is to be dissipated.

The cooling, more precisely the removal of the power loss in the form of heat, thus initially takes place by way of the conduction of heat. For this purpose, the heat transport body 18 made of a thermally conductive material, preferably made of aluminum, is therefore thermally coupled to the part 15, 16 to be cooled and the heat is dissipated by physical contact. The heat transport body 18 is preferably designed as a frame, block, shell or baseplate and individually adapted to the arrangement of the parts (heat sources) 15, 16 on the circuit board 17. It additionally serves as a housing which at least partially encases the circuit board 17 or the module 3. At the same time, the heat transport body 18 serves to protect from damage to the circuit board 17 and the parts 15, 16 connected thereto and/or to protect further components (not shown) of the module 3.

While the heat transport body 18, in the exemplary embodiment shown in FIG. 1, is merely arranged on one side of the circuit board 17, in the exemplary embodiment shown in FIG. 3 the circuit board 17 is surrounded by the heat transport body 18 on both sides, which for this purpose consists of two aluminum shells which form a housing, into which the circuit board 17 is effectively embedded. In this context contacting bodies 19, such as milled domes for example, which in the assembled state extend out from the plate-shaped base body 21 of the heat transport body 18 in the rack longitudinal direction 7 and on which contact areas 22 are embodied, abut the heat sources ("hot spots") 15 of the module 3 or the base body 21 itself abuts one such heat source 16 with a contact area 23. For transferring heat from the parts 15, 16 arranged on the circuit board 17 to the heat transport body 18, a suitable heat transfer means, for example a thermal paste, may be applied to the contact areas 22, 23.

In the assembled state, the circuit board 17 of the module 3 and, at the same time, also the plate-shaped base body 21 of the heat transport body 18 stand perpendicular and in parallel with the side parts 5, 6 between the upper and lower connecting webs 8, 9 of the rack 2. For mechanically securing its position, the circuit board 17 can be inserted into guides 24 of the rack 2 provided for this purpose. These guides 24, 25 are attached to the upper and lower connecting webs 8, 9 as required. In the assembled state, the circuit board 17 standing perpendicular in its installed position is therefore inserted both into an upper guide 24 and into a lower guide 25 of the rack 2.

Simultaneously, the heat transport body 18 of the module 3 can be fastened in a heat-transferring and releasable manner to at least one heat distribution body 26 of the rack 2, in order to enable a sufficient conduction of heat from the module 3 to the rack 2. In this context, a wedge lock apparatus 27 preferably serves to fasten the heat transport body 18 to the heat distribution body 26 in a heat-transferring manner. Instead of a wedge lock apparatus 27, another positive connection can be used in order to transfer the power loss to the heat distribution body 26. Here, it is still possible to swap the modules 3 as before by releasing the positive connection.

The heat transport body 18, which abuts the conduction-cooled multi-core processor 15 or a further conduction-cooled part 16 with its contact areas 22, 23 on one side, on another side has a plate shape at its connecting ends 28 facing upward and downward in the assembled state, so that it can be secured in the heat distribution body 26 of the rack 2 using the wedge lock apparatus 27. The heat distribution body 26, which is fastened to the upper connecting webs 8 and is placed immediately adjacent to the upper guide 24 of the rack 2, for this purpose has at least one guide arrangement consisting of parallel coupling members, an insertion slot 31 being produced therebetween for an assembly-side plate edge 32 of the base body 21 of the heat transport body 18.

While in the one embodiment of the invention one or more heat distribution bodies 26 are only provided above the module 3 (FIG. 1), in other embodiments heat distribution bodies 26 may also be provided below the module 3, in particular when the heat distribution bodies 33 are designed as housings and thus are heavy, which enclose the circuit board 17 on both sides and thus effectively embed it (FIG. 3). In these cases, these underlying heat distribution bodies 33 serve in the first instance to mechanically fasten the module 3 in the rack 2, preferably in the same manner as in the case of the overhead heat distribution bodies 26; a significant transfer of heat from the module 3 to the bottom side 11 of the rack 2, however, is not intended for the purpose of dissipating heat from the module 3. If the circuit board 17 is embedded into the heat transport body 18, as illustrated in FIG. 3, then separate guides 24, 25 for the circuit board 17 are not necessarily required. Instead, the circuit board 17 may be fastened in the heat transport body 18, for example between the two half-shells which form the housing.

The structure and mode of operation of the wedge lock apparatus 27 are described below, without the components of the wedge lock apparatus 27 being shown in detail in the figures. The wedge lock apparatus typically comprises a center wedge, which has inclined surfaces at its two opposite ends, and two end wedges, each having an inclined surface, which abut the inclined surfaces of the center wedge. In the figures, merely the outer head area of the front end wedge 29 is shown in this context. Here, the center wedge is embodied such that it can be fastened to the plate edge 32 of the heat transport body 18. A spindle extends in the longitudinal direction, here corresponding to the rack transverse direction 4, through the center wedge and connects the center wedge to the two end wedges. The end wedge facing away from the screw head 34 possesses a threaded hole, into which the spindle engages such that a rotation of the spindle in the clockwise direction pulls the two end wedges together. As the inclined surfaces of the two end wedges abut against the inclined surfaces of the center wedge, the rotation of the spindle causes the end wedges to spread out transversely to the outside. This means that the effective width of the wedge lock is enlarged to the width of the insertion slot 31, so that the wedge slot itself brings about a fixing in the insertion slot 31. A further rotation of the spindle in the clockwise direction tenses the apparatus further. It is possible to release the wedge lock by rotating the spindle in the opposite direction, whereby the two ends of the wedges spread apart in the longitudinal direction and the effective width of the wedge lock structure is reduced, so that the clamping force of the wedge lock structure within the insertion slot 31 is reduced to the extent that the plate edge 32 of the heat transport body 18 can be removed from the insertion slot 31.

Thus, while the module 3, more precisely the circuit board 17, is inserted into corresponding guides 24, 25 of the rack 2, wherein no heat or only an insignificant amount of the heat arising within the module 3 is transferred via said mechanical connection, the heat transport body 18, which has absorbed the heat via its contact areas 22, 23, preferably transfers said heat via specific wedge locks or tensioning wedges, which likewise consist of a thermally conductive material, directly to the rack 2, more precisely to the heat distribution body 26 attached to the rack 2, which is preferably designed as a solid material block. In this context, the heat distribution body 26 is likewise made of aluminum or consists of another suitable material. Subsequently, the heat is emitted from the heat distribution body 26 to one or more heat pipes 35, which have a high thermal conductivity value and preferably extend substantially over the entire length or width of the rack 2.

For this purpose, a plurality of heat pipes 35 of the same construction are attached to the at least one heat distribution body 26 at regular intervals, these serving to distribute the heat over the entire structural width 36 of the rack 2, from where the heat can be guided out or away from the rack 2 by convection cooling. The heat pipes 35 are coupled at their contact areas 37 to the heat distribution body 26. The heat distribution body 26 is preferably arranged overhead in relation to the rack 2 and for this purpose is attached to the upper connecting webs 8 such that its heat distribution body outer side 38 abuts the top side 12 of the rack 2 or protrudes from the top side 12 such that the heat pipes 35 coupled thereto likewise run along the top side 12 of the rack 2, more precisely at a defined distance from said top side 12. Preferably, in this context the heat pipes 35 are arranged outside the internal volume 14 defined by the frame 5, 6, 8, 9 of the rack 2. In any case, the heat pipes 35 always run above the modules 3 to be cooled from the perspective of convection cooling, so that a self-heating of the modules 3 due to heat emitted by the heat pipes 35 is avoided. Preferably, the heat pipes 35 extend in the rack transverse direction 4. In the illustrated example, six heat pipes 35 connected to the heat distribution body 26 are arranged so as to lie in parallel with one another.

The heat dissipation concept according to the invention can not only be used in racks 2 which have a single module 3 with parts 15, 16 which are to be cooled in this manner. The concept can also be transferred to racks 2 in which two, three or more of said modules 3 are accommodated. In this context, the arrangement of the heat distribution bodies 26 as well as the heat pipes 35 connected thereto has to be adapted to the placement of the modules 3 in the rack 2, or vice versa.

Preferably, the heat distribution body 26 is mounted close to the one side part 5 of the rack 2, so that a heat pipe 35 emerging from the heat distribution body 26 can extend over as great a path length as possible over the entire width 36 of the rack 2, up to the opposite side part 6. If only a single processor module 3 is present, then the heat distribution body 26 positioned in this way is retained (FIG. 1). If two processor modules 3 are accommodated in the rack 2 (FIG. 3), then this likewise applies for the first heat distribution body 26, but in addition a second heat distribution body 39 arranged above is provided centrally between the two side parts 5, 6 of the rack 2 and from each of the two heat distribution bodies 26, 39 the heat pipes 35 each extend over approximately half the width 36 of the rack 2, in this context once again utilizing the available surface of the rack 2 as fully as possible. FIG. 3 shows the centrally arranged module 3 with its front plate 41.

In this context, the heat pipes 35 may run at a defined distance from the top side 12 of the rack 2, as shown in FIG. 1. In this case, the heat pipes 35 are designed such that they are bent in a U-shape at their connecting side 42 toward the heat distribution body 26, wherein the lower U-leg 43 rests with the contact area 37 against the outer side 38 of the heat distribution body 26, while the upper U-leg 44, which lies in a vertical plane with the lower U-leg 43, extends away from the heat distribution body 26 in the direction of the opposite side part 6 of the rack 2.

The heat pipes 35 may also, however, be arranged as straight pipes with little distance from the rack 2 and thus in a space-saving manner, as shown in FIG. 3. They are then thermally connected at their connecting sides 42 with their contact areas 37 to the outer sides 38 of the heat distribution bodies 26, 39.

The coupling of the heat transport body 18 to the heat sources 15, 16 and/or the coupling of the heat transport body 18 to the heat distribution body/bodies 26, 39 of the rack 2 and/or the coupling of the heat pipes 35 to the heat distribution body/bodies 26, 39 takes place in a heat-transferring manner via suitable thermal contact areas, which preferably involve flat areas, so that a positive connection can be made in each case. The corresponding thermal contact areas are preferably embodied as large as possible for transferring large heat flows.

The mode of operation of a heat pipe 35 as a heat exchanger, which uses evaporation heat of a medium to enable a transport of large quantities of heat, is known in principle to the person skilled in the art. A so-called heat pipe is preferably used here, typically in the form of a pipe-shaped volume in which the working medium of the heat pipe 35 is situated. The working medium evaporating when heat is applied in the heating zone of the heat pipe 35, i.e. in the region of the coupling of the heat pipe 35 to the heat distribution body 26, 39, flows to the cooling zone of the heat pipe 35, where it condenses and the condensation heat being released can be emitted to the surrounding area. The working medium, now liquid, returns to the point at which the heat was introduced, by way of capillary forces. The use of heat pipes is advantageous, as the process of guiding the working medium back to the evaporator is independent of position, as opposed to such heat pipes 35 which operate according to the thermosiphon principle, in which the liquid working medium is guided back by gravitational force. The heat pipes used here are thus able to be attached to the rack 2 horizontally, as shown, without having to worry about drying out because the condensed working medium is not flowing back fast enough due to too flat an incline.

The heat pipes 35 are provided on their surfaces with a large number of cooling bodies 45, which are preferably designed as cooling fins. As the heat pipes 35 preferably extend over the entire width 36 of the rack 2, preferably substantially the entire top side 12 of the rack 2 is provided with cooling bodies 45, so that a very large cooling area is formed. This also makes it possible for the power loss, which is considerably higher in the case of multi-core processors, to be emitted to the surrounding area by way of simple free convection of the air along the cooling bodies 45. The emission of the power loss to the surrounding air thus takes place without fans.

The cooling bodies 45 used preferably have a plate-shaped design, wherein the plates are oriented vertically, so that they support the removal of the heat by means of convection cooling, wherein the air current 13 along the wide-area longitudinal sides of the cooling body plates runs from bottom to top through said cooling body plates. In this context, separate cooling bodies 45 are preferably not provided for each heat pipe 35. Instead, the cooling bodies 45 which run in the rack transverse direction 4 and are arranged in parallel with one another are each connected to all six heat pipes 35, which produces a particularly even distribution of the heat emission to the air flowing through.

Depending on the placement of the heat pipes 35, the cooling bodies 45 are arranged above the internal volume 14 of the rack 2 (FIG. 1) or at least partially protrude into said internal volume 14 (FIG. 3).

The cooling bodies 45 are arranged and their type and shape are chosen with the aim of providing as large a cooling body area as possible, in particular maximizing the number of cooling bodies 45 over the area of the rack 2. Here, the heat pipes 35 make it possible to transport the heat to be emitted via the cooling bodies 45 to the point of the rack 2 furthest away from the heat distribution body 26, 39, in order to use the greatest possible area of the rack 2 for the purpose of heat dissipation. According to the invention, the power loss in the form of heat is therefore guided away from the module 3; in this context, however, the heat is not transported to a heat sink remote from the rack in order to emit the heat. Instead, the heat sink is manifested as part of the rack 2 and thus in the immediate vicinity of the internal volume 14 of the rack 2, here in the form of the heat pipes 35 with cooling bodies 45, so that the dissipation of the emitted heat, more precisely the removal of the heat from the rack 2, can take place by way of the air current running through the internal volume 14 of the rack 2.

As an alternative to a large number of individual (small) cooling bodies, it is likewise possible to use an individual (large) cooling body provided with apertures or openings for the passage of the convention current, with a large number of cooling areas for attaching to the heat pipes 35, or a plurality of such (large) cooling bodies.

As the modular system 1 continues to be formed by standard 19" rack technology, in addition to modules with heat dissipation taking place with the aid of the heat dissipation concept according to the invention, it is also possible to populate it conventionally with modules having little power loss (not shown). These modules, e.g. peripheral modules for digital input/output, data interfaces etc., thus continue to emit the heat via the surface of the part and can be integrated into the rack 2 in the usual manner. In other words, it continues to be possible to install modules with little power loss in the rack 2 equipped for cooling according to the invention in the conventional manner, without having to use the heat dissipation concept according to the invention. The fanless cooling system 10 proposed by the invention with heat transport body 18, heat distribution body 26, 39 and heat pipes 35 thus does not inhibit using the rack populated with modules in a traditional manner, without applying the specific heat dissipation concept. Racks 2, which have been equipped in the sense of the heat dissipation concept according to the invention as described above, are therefore able to be used in a particularly universal manner.

The fastening structures for the heat pipes 35 and the cooling bodies 45 attached thereto, as well as possible peripheral modules, further guide rails and portions of the rack, are not shown in the figures for the sake of clarity.

Although the invention has been illustrated and described in detail using the preferred exemplary embodiment, the invention is not limited to the disclosed examples and other variants can be derived therefrom by the person skilled in the art without departing from the scope of protection of the invention.

LIST OF REFERENCE CHARACTERS

1 Electronic modular system
2 Rack
3 Module, multi-processor module
4 Rack transverse direction
5 Rack side part
6 Rack side part
7 Rack longitudinal direction
8 Upper rack connecting web
9 Lower rack connecting web
10 Cooling system
11 Rack bottom side
12 Rack top side
13 Air current
14 Internal volume of the rack
15 Processor, heat source
16 Electrical/electronic part, heat source
17 Circuit board
18 Heat transport body
19 Contacting body
20 (not allocated)
21 Base body of the heat transport body
22 First contact area of the heat transport body
23 Second contact area of the heat transport body
24 Upper guide
25 Lower guide
26 Upper heat distribution body
27 Wedge lock apparatus
28 Connecting end
29 End wedge
30 (not allocated)
31 Insertion slot
32 Plate edge
33 Lower heat distribution body
34 Screw head
35 Heat pipe
36 Structural width of the rack
37 Contact area
38 Outer side of the heat distribution body
39 Upper heat distribution body
40 (not allocated)
41 Front plate
42 Connecting side
43 Lower U-leg
44 Upper U-leg
45 Cooling body

The invention claimed is:

1. A fanless cooling system for electronic modular systems to be used in vehicles or rail vehicles, the cooling system comprising:
   a rack for accommodating at least one module or processor module having at least one electronic component, said rack having at least one heat distribution body, said rack having a bottom side and a top side, and said bottom side and said top side being at least partially permeable to air;
   a heat transport body directly connected to the at least one electronic component of the at least one module, said heat transport body being in direct contact with said at least one electronic component in a heat-transferring manner;
   said heat transport body configured to be fastened to said at least one heat distribution body in a heat-transferring manner when the at least one module, having the at least one electronic component to which said heat transport body is directly connected, is accommodated in said rack; and
   at least one heat pipe connected to said heat distribution body in a heat-transferring manner at said upper side of said rack.

2. The cooling system according to claim 1, wherein said heat transport body is a housing at least partially enclosing a circuit board of the at least one module.

3. The cooling system according to claim 1, which further comprises a wedge lock apparatus for fastening said heat transport body to said heat distribution body in a heat-transferring manner.

4. The cooling system according to claim 1, wherein said at least one heat pipe extends substantially over an entire available width of said rack.

5. The cooling system according to claim 1, wherein said at least one heat pipe has a multiplicity of cooling bodies.

6. The cooling system according to claim 5, wherein said cooling bodies are configured to emit heat to be removed by a convection current running through an internal volume of said rack.

7. An electronic modular system, comprising:
- a processor module having a plurality of multi-core processors for a vehicle-side computer platform for train protection equipment; and
- a fanless cooling system according to claim 1 for cooling said processor module accommodated in said rack.

8. A fanless cooling system for electronic modular systems to be used in vehicles or rail vehicles, the cooling system comprising:
- a rack for accommodating at least one module or processor module having at least one electronic component, said rack having at least one heat distribution body, said rack having a bottom side and a top side, and said bottom side and said top side being at least partially permeable to air;
- a heat transport body to be directly connected in heat transferring contact with the at least one electronic component of the at least one module;
- said heat transport body configured to be fastened to said at least one heat distribution body in a heat-transferring manner when the at least one module, having the at least one electronic component to which said heat transport body is coupled, is accommodated in said rack; and
- at least one heat pipe connected to said heat distribution body in a heat-transferring manner at said upper side of said rack.

* * * * *